United States Patent
Sheridan et al.

(10) Patent No.: US 9,673,312 B2
(45) Date of Patent: Jun. 6, 2017

(54) POWER SEMICONDUCTOR DEVICE WITH OVER-CURRENT PROTECTION

(71) Applicant: RF Micro Devices, Inc., Greensboro, NC (US)

(72) Inventors: David Charles Sheridan, Greensboro, NC (US); Xing Huang, Ewing, NJ (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/831,428

(22) Filed: Aug. 20, 2015

(65) Prior Publication Data

US 2016/0056151 A1 Feb. 25, 2016

Related U.S. Application Data

(60) Provisional application No. 62/039,618, filed on Aug. 20, 2014.

(51) Int. Cl.
| | |
|---|---|
| *H01L 27/088* | (2006.01) |
| *H01L 29/78* | (2006.01) |
| *H01L 29/16* | (2006.01) |
| *H01L 21/8236* | (2006.01) |
| *H03K 17/082* | (2006.01) |

(52) U.S. Cl.
CPC .......... *H01L 29/78* (2013.01); *H01L 21/8236* (2013.01); *H01L 27/0883* (2013.01); *H01L 29/16* (2013.01); *H03K 17/0822* (2013.01)

(58) Field of Classification Search
CPC ........................ H01L 27/0883; H01L 21/8236
See application file for complete search history.

(56) References Cited

U.S. PATENT DOCUMENTS

| | | | | |
|---|---|---|---|---|
| 4,820,999 A | * | 4/1989 | Csanky | H03F 1/223 330/277 |
| 2014/0225163 A1 | * | 8/2014 | Briere | H01L 27/0248 257/195 |

OTHER PUBLICATIONS

Castellazzi, A. et al., "Short-Circuit Tests on SiC Power MOSFETs," 2013 IEEE 10th International Conference on Power Electronics and Drive Systems (PEDS), Apr. 22-25, 2013, IEEE, pp. 1297-1300.
Huang, Xing et al., "Short-Circuit Capability of 1200V SiC MOSFET and JFET for Fault Protection," 2013 Twenty-Eighth Annual IEEE Applied Power Electronics Conference and Exposition (APEC), Mar. 17-21, 2013, IEEE, pp. 197-200.
Huang, Xiucheng et al., "Evaluation and Application of 600V GaN HEMT in Cascode Structure," 2013 Twenty-Eighth Annual IEEE Applied Power Electronics Conference and Exposition (APEC), Mar. 17-21, 2013, IEEE, pp. 1279-1286.

(Continued)

*Primary Examiner* — Phat X Cao
(74) *Attorney, Agent, or Firm* — Withrow & Terranova, P.L.L.C.

(57) ABSTRACT

A power semiconductor device has an upper transistor and a lower transistor that is coupled in cascode with the upper transistor. The upper transistor comprises an upper drain, upper gate, and an upper source. The lower transistor comprises a lower drain that is coupled to the upper source, a lower gate, and a lower source that is coupled to the upper gate. The upper transistor is a depletion mode device and has a first saturation current. The lower transistor is an enhancement mode device and has a second saturation current, which is lower than the first saturation current.

15 Claims, 2 Drawing Sheets

(56) References Cited

OTHER PUBLICATIONS

Rodriguez, Alberto et al., "Switching Performance Comparison of the SiC JFET and the SiC JFET/Si MOSFET Cascode Configuration," 2013 IEEE Energy Conversion Congress and Exposition (ECCE), Sep. 15-19, 2013, IEEE, pp. 472-479.

Weis, B. et al., "Turn-off and short circuit behaviour of 4H SiC JFETs," Conference Record of the 2001 IEEE Industry Applications Conference Thirty-Sixth IAS Annual Meeting, Sep. 30-Oct. 4, 2001, IEEE, pp. 365-369.

\* cited by examiner

US 9,673,312 B2

POWER SEMICONDUCTOR DEVICE WITH OVER-CURRENT PROTECTION

RELATED APPLICATIONS

This application claims the benefit of provisional patent application Ser. No. 62/039,618, filed Aug. 20, 2014, the disclosure of which is hereby incorporated herein by reference in its entirety.

FIELD OF THE DISCLOSURE

The present disclosure relates to power semiconductor devices and in particular to power semiconductor devices with over-current protection.

BACKGROUND

Power semiconductor devices, such as field effect transistors (FETs) that are used in high power applications, are often subjected to excessive currents that exceed safe operating limits during fault conditions. Being subjected to excessive currents can destroy the devices or shorten the life of the devices, especially those devices that do not have associated over-current protection. As such, there is a need for cost effective and reliable over-current protection for power semiconductor devices.

SUMMARY

Disclosed is a power semiconductor device having an upper transistor and a lower transistor that is coupled in cascode with the upper transistor. The upper transistor comprises an upper drain, upper gate, and an upper source. The lower transistor comprises a lower drain that is coupled to the upper source, a lower gate, and a lower source that is coupled to the upper gate. The upper transistor is a depletion mode device and has a first saturation current. The lower transistor is an enhancement mode device and has a second saturation current, which is lower than the first saturation current.

In one embodiment, the upper transistor is a high electron mobility transistor (HEMT), and the lower transistor is a metal oxide semiconductor field effect transistor (MOSFET). The upper and lower transistors may be formed from different material systems and integrated into a single integrated circuity package. For example, the HEMT may be formed from gallium nitride (GaN), and the MOSFET may be formed from silicon (Si).

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above," or "upper" or "lower," or "horizontal" or "vertical" may be used herein to describe a relationship of one element, layer, or region to another element, layer, or region as illustrated in the figures. It will be understood that these terms and those discussed above are intended to encompass different orientations of the device in addition to the orientation depicted in the figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
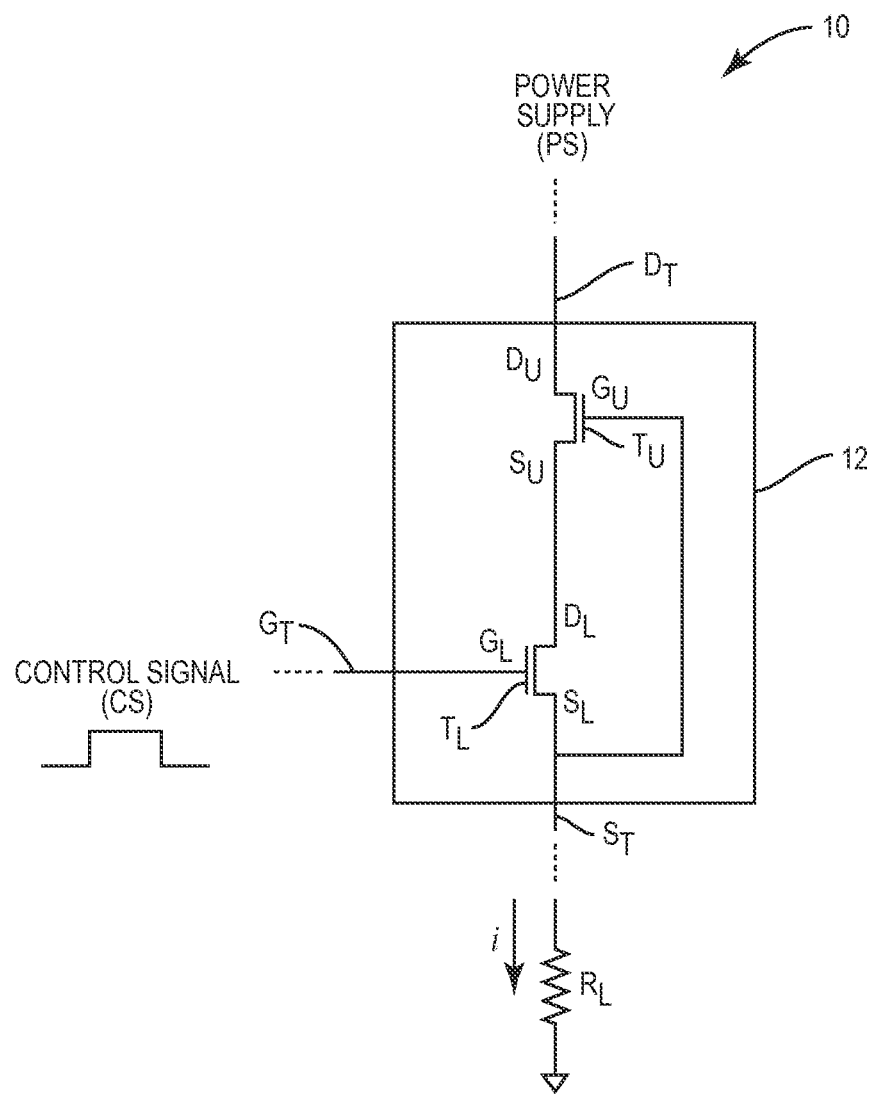
FIG. 1 is a circuit diagram of a power semiconductor device according to one embodiment of the invention.

With reference to FIG. 1, the present disclosure relates to a power semiconductor device 10 that includes an upper transistor $T_U$ and a lower transistor $T_L$, which are coupled in cascode and may be formed in a integrated circuit package 12. In one embodiment, the upper transistor $T_U$ is a depletion mode high electron mobility transistor (HEMT) while the lower transistor is an enhancement mode metal oxide semiconductor field effect transistor (MOSFET). Further, the upper transistor $T_U$ may be configured to have a significantly lower saturation current than the lower transistor $T_L$ and perhaps a significantly higher reverse breakdown voltage. For example, the saturation current of the lower transistor $T_L$ may be less than or equal to 70%, 50%, 40%, or 30% of the upper transistor $T_U$. The reverse breakdown voltage of the upper transistor $T_U$ may exceed that of the lower transistor by a multiple of at least 5, 10, 15, or 20.

The upper transistor and the lower transistor may be formed using different material systems. One combination that has proven effective is the use of a GaN-based (Gallium Nitride) depletion HEMT for the upper transistor $T_U$ and a Si-based (Silicon) enhancement mode MOSFET for the lower transistor $T_L$. Upon understanding the concepts disclosed herein, those skilled in the art will recognize other acceptable material system combinations for the upper and lower transistors $T_U$, $T_L$. The combinations are considered within the scope of this disclosure.

The cascode coupled upper and lower transistors $T_U$ and $T_L$ of the power semiconductor device 10 emulate a single, N-channel field effect transistor (FET), which has significantly improved short circuit handling capabilities relative to a typical, discrete power FET formed from the same or similar material systems. As such, the power semiconductor device 10 may have three terminals: a drain terminal $D_T$, a gate terminal $G_T$, and a source terminal $S_T$, which correspond to the drain, gate, and source terminals of a typical, N-channel FET. The upper transistor $T_U$ includes a drain, gate, and source, which are respectively referred to as an upper drain $D_U$, upper gate $G_U$, and upper source $S_U$ for ease of reference. Similarly, the lower transistor $T_L$ includes a drain, gate, and source, which are respectively referred to as a lower drain $D_L$, lower gate $G_L$, and lower source $S_L$.

The upper drain $D_U$ of the upper transistor $T_U$ is coupled to the drain terminal $D_T$ of the power semiconductor device 10. The lower gate $G_L$ of the lower transistor $T_L$ is coupled to the gate terminal $G_T$ of the power semiconductor device 10. The lower source $S_L$ of the lower transistor $T_L$ is coupled to the source terminal $S_T$ of the power semiconductor device. The upper source $S_U$ of the upper transistor $T_U$ is coupled to the lower drain $D_L$ of the lower transistor $T_L$. The upper gate $G_U$ of the upper transistor $T_U$ is coupled to the lower source $S_L$ of the lower transistor $T_L$, which as noted above, is also coupled to the source terminal $S_T$ of the power semiconductor device 10.

To describe the operation of the power semiconductor device 10, assume the upper and lower transistors $T_U$ and $T_L$ have the following characteristics. These characteristics are merely exemplary and used only to help understand the theory of operation of the power semiconductor device 10. For the upper transistor $T_U$, assume a depletion mode, GaN-based HEMT that has a reverse breakdown voltage of 650 volts (V) and requires a gate-to-source voltage ($V_{GS}$) of around −5 V to turn off. As those skilled in the art will appreciate, a depletion mode HEMT is normally on, and as such, will be turned on when $V_{GS}$ is around 0 V. The upper transistor $T_U$ gradually transitions from a fully on state to a completely off state as $V_{GS}$ transitions from 0 V to −5 V, and as such, gradually clamps down on the amount of current (drain current) that is allowed to flow from the upper drain $D_U$ to the upper source $S_U$ as $V_{GS}$ transitions from 0 V to −5 V.

For the lower transistor $T_L$, assume an enhancement mode, Si-based MOSFET that has a reverse breakdown voltage of 20 V and requires a gate-source voltage ($V_{GS}$) of 2 V to turn on. As those skilled in the art will appreciate, an enhancement mode MOSFET is normally off, and as such, will be turned off when $V_{GS}$ is around 0 V. The lower transistor $T_L$ gradually transitions from a fully off state to an on state as $V_{GS}$ transitions from 0 V to 2 V. As noted above, assume that saturation current for the lower transistor $T_L$ is significantly less than that of the upper transistor $T_U$.

For a simple example, assume that the power semiconductor device 10 is coupled in series between a power supply PS and a load $R_L$. Further assume that a control signal CS is used to provide a pulsed signal to the gate terminal $G_T$, which is coupled to the lower gate $G_L$ of the lower transistor $T_L$. In response to the pulsed signal, the lower transistor $T_L$ will switch on and off, which will cause the upper transistor $T_L$ to switch on and off in unison with the lower transistor $T_L$. When the upper and lower transistors $T_U$, $T_L$ are on, a normal current i will flow through the upper and lower transistors $T_U$, $T_L$ and the load $R_L$ to ground. When the upper and lower transistors $T_U$, $T_L$ are off, the normal current i will not flow through the upper and lower transistors $T_U$, $T_L$.

If a fault condition occurs, such as a short circuit of the load $R_L$, the normal current i flowing through the load $R_L$ may spike to fault current i, which has a level significantly higher than normal. If the control signal CS is in a phase where the upper and lower transistors $T_U$, $T_L$ are off, the current i is naturally blocked. If the control signal CS is in a phase where the upper and lower transistors $T_U$, $T_L$ are on or are transitioning from off to on, the power semiconductor device 10 will quickly and automatically function to limit the fault current i to a level that will not harm either the upper or lower transistors $T_U$, $T_L$, at least for an amount of time necessary for the control signal CS to stop any switching.

Assuming the power supply PS is operating at 400 V and the upper and lower transistors $T_U$, $T_L$ are on or turned on during the fault condition, the drain-to-source voltage ($V_{DS}$) of the upper transistor $T_U$ will reach approximately 400 V and the fault current i will spike from normal levels. Since the lower transistor $T_L$ has a lower saturation current than the upper transistor $T_U$, the lower transistor $T_L$ will inherently begin to limit the fault current i. The relatively large fault current i flowing through the lower transistor $T_L$ naturally causes the $V_{DS}$ of the lower transistor $T_L$ to increase in proportion to the magnitude of the fault current i, because the internal resistance of the lower transistor $T_L$ will increase with current. The increase in $V_{DS}$ of the lower transistor $T_L$ causes the voltage at the lower drain $D_L$ to increase relative to that at the lower source $S_L$ of the lower transistor $T_L$. Since the lower drain $D_L$ of the lower transistor $T_L$ is coupled to the upper source $S_U$ of the upper transistor $T_U$, the voltage at the upper source $S_U$ of the upper transistor $T_U$ will increase relative to the lower source $S_L$ of the lower transistor $T_L$. Since the lower source $S_L$ of the lower transistor $T_L$ is coupled to the upper gate $G_U$ of the upper transistor $T_U$, an increase in the voltage at the upper source $S_U$ of the upper transistor $T_U$ results in a corresponding decrease in $V_{GS}$ (e.g. $V_{GS}$ increasing in a negative direction below 0 V) of the upper transistor $T_U$. For example, $V_{DS}$ of the lower transistor $T_L$ may transition from approximately 0 V to 4 V while $V_{GS}$ of the upper transistor $T_U$ may transition from approximately 0 V to −4 V.

The upper transistor $T_U$ limits the fault current i as the channel in the upper transistor $T_U$ pinches off in proportion to the reduction in $V_{GS}$ of the upper transistor $T_U$. Notably, the reduction in the fault current i in turn reduces the $V_{DS}$ of the lower transistor $T_L$, which causes $V_{GS}$ of the upper transistor $T_U$ to increase. As a result, the fault current i will stop decreasing and actually begin to rise until a final short circuit current i is reached. For example, once the $V_{DS}$ of the lower transistor $T_L$ reaches a peak value of 4 V, $V_{DS}$ may transition from 4 V to 2.8 V while $V_{GS}$ of the upper transistor $T_U$ may transition from approximately −4 V to −2.8 V, where an equilibrium is reached at a current level that is less than the saturation current of either the upper or lower transistor $T_U$, $T_L$. This equilibrium corresponds to the intersection point of the drain current versus $V_{DS}$ curve of the lower transistor $T_L$ and the drain current versus $-V_{GS}$ curve of the upper transistor $T_U$.

Figure 2:
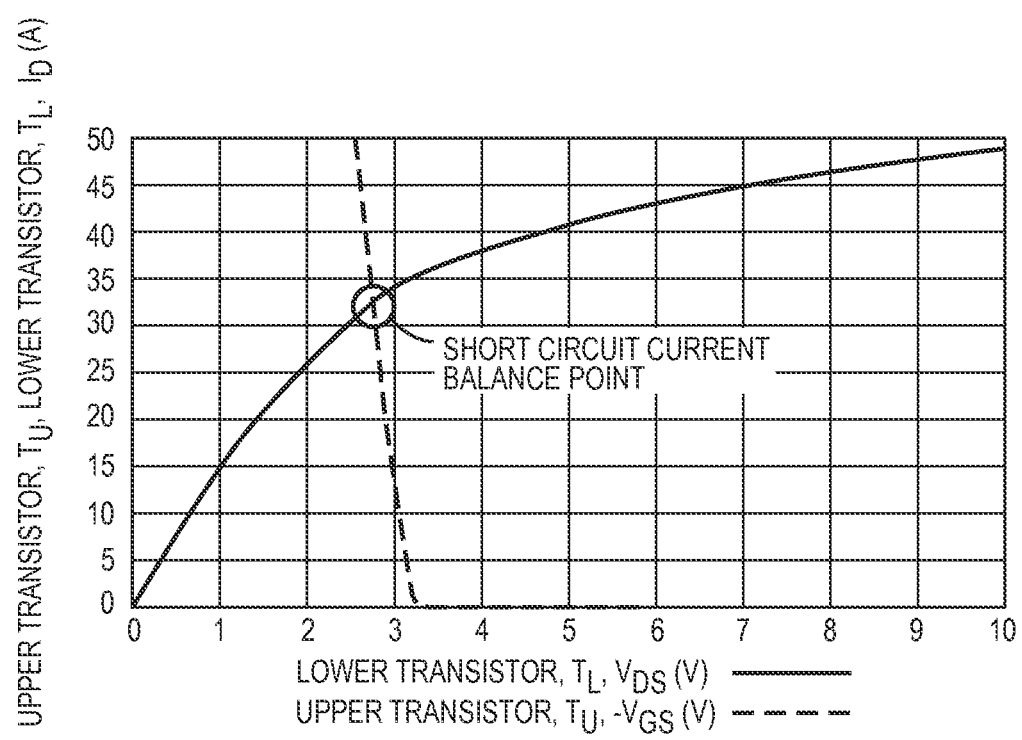
FIG. 2 is a graph of exemplary drain current versus $-V_{GS}$ (negative gate-to-source voltage) of an upper field effect transistor (FET) and drain current versus $V_{DS}$ (drain-source voltage) of a lower FET of the power semiconductor device of FIG. 1.

FIG. 2 illustrates a scenario where drain current ($I_D$) versus $V_{DS}$ curve of the lower transistor $T_L$ and the drain current ($I_D$) versus $-V_{GS}$ of the upper transistor $T_U$ cross at 2.8 V, resulting in a final short circuit current i of 32 amperes (A). The final short circuit current is considered a current that the upper and lower transistors $T_U$ and $T_L$ can withstand for a specified duration, which may vary greatly depending on the application, but is typically in the microseconds or milliseconds range. The specified duration generally corresponds to an amount of time that it would safely take an external control system to configure the control signal CS to turn off the power semiconductor device 10 and keep the power semiconductor device 10 in an off state (e.g. stop switching).

In essence, the lower transistor $T_L$ is designed to have a saturation current that both limits the peak short circuit current through the upper and lower transistors $T_U$, $T_L$, and self-biases the upper transistor $T_U$ during a short circuit (e.g. excessive current) to a level that is less than the saturation current levels of either of the upper and lower transistors $T_U$, $T_L$.

The power semiconductor device 10 of the present disclosure is particularly applicable to any high power applications where over-current protection is beneficial. In certain embodiments, the power semiconductor device 10 emulates and is designed to replace a high power FET with reverse breakdown voltages of greater than or equal to 100 V, 400 V, 650 V, 800 V, 1000 V, or more as well as forward current ratings of greater than equal to 10 A, 20 A, 50 A, 100 A, or more. These devices may be used in various high power bridges, rectifiers, inverters, DC-DC converters, and the like. In addition to a HEMT, upper transistor $T_U$ may be a MOSFET, junction field effect transistor (JFET), or other FET device, and as noted above, be made from silicon (Si), silicon carbide (SiC), gallium arsenide (GaAs), gallium nitride (GaN), or a wide variety of semiconductor materials. The lower transistor $T_L$ is typically a Si-based MOSFET to reduce cost and provide low resistance, gate charge, and reverse recovery current, but may employ another material system.

Those skilled in the art will recognize improvements and modifications to the embodiments of the present disclosure. All such improvements and modifications are considered to be within the scope of the concepts disclosed herein and the claims that follow.

What is claimed is:

1. A power semiconductor device comprising:
   an upper high electron mobility transistor (HEMT) comprising an upper drain, an upper gate, and an upper source;
   a lower metal oxide semiconductor field effect transistor (MOSFET) coupled in cascode with the upper HEMT and comprising a lower drain that is coupled to the upper source, a lower gate, and a lower source that is coupled to the upper gate, wherein:
   the upper HEMT is a depletion mode device and has a first saturation current;
   the lower MOSFET transistor is an enhancement mode device and has a second saturation current; and
   the second saturation current is less than or equal to 70% of the first saturation current.

2. The power semiconductor device of claim 1 wherein the upper HEMT is a gallium nitride (GaN) HEMT.

3. The power semiconductor device of claim 2 wherein the lower MOSFET is a silicon (Si) MOSFET.

4. The power semiconductor device of claim 1 wherein the second saturation current is less than or equal to 50% of the first saturation current.

5. The power semiconductor device of claim 1 wherein the second saturation current is less than or equal to 30% of the first saturation current.

6. The power semiconductor device of claim 1 wherein the upper HEMT has a reverse breakdown voltage that is greater than or equal to 5 times a reverse breakdown voltage of the lower MOSFET.

7. The power semiconductor device of claim 1 wherein the upper HEMT has a reverse breakdown voltage that is greater than or equal to 10 times a reverse breakdown voltage of the lower MOSFET.

8. The power semiconductor device of claim 7 wherein the reverse breakdown voltage of the upper HEMT is at least 400 volts.

9. The power semiconductor device of claim 1 wherein the second saturation current is less than or equal to 50% of the first saturation current, and the upper HEMT has a reverse breakdown voltage that is greater than or equal to 10 times a reverse breakdown voltage of the lower MOSFET.

10. The power semiconductor device of claim 1 wherein the upper HEMT is formed from a first semiconductor material system, and the lower MOSFET is formed from a second semiconductor material system, which is different from the first semiconductor material system.

11. The power semiconductor device of claim 8 wherein the upper HEMT is a gallium nitride (GaN) HEMT, and the lower MOSFET is a silicon (Si) MOSFET.

12. The power semiconductor device of claim 8 wherein the second saturation current is less than or equal to 50% of the first saturation current.

13. The power semiconductor device of claim 8 wherein the second saturation current is less than or equal to 30% of the first saturation current.

14. The power semiconductor device of claim 1 wherein:
   the second saturation current is less than or equal to 30% of the first saturation current;
   the upper transistor has a reverse breakdown voltage that is greater than or equal to 5 times a reverse breakdown voltage of the lower transistor; and
   the reverse breakdown voltage of the upper transistor is at least 400 volts.

15. The power semiconductor device of claim 14 wherein the upper HEMT is a gallium nitride (GaN) HEMT, and the lower MOSFET is a silicon (Si) MOSFET.

* * * * *

UNITED STATES PATENT AND TRADEMARK OFFICE
CERTIFICATE OF CORRECTION

| | |
|---|---|
| PATENT NO. | : 9,673,312 B2 |
| APPLICATION NO. | : 14/831428 |
| DATED | : June 6, 2017 |
| INVENTOR(S) | : David Charles Sheridan and Xing Huang |

Page 1 of 1

It is certified that error appears in the above-identified patent and that said Letters Patent is hereby corrected as shown below:

In the Claims

In Column 6, Line 3, in Claim 1, replace "MOSFET transistor" with --MOSFET--.

Signed and Sealed this
Twenty-fifth Day of July, 2017

Joseph Matal
*Performing the Functions and Duties of the*
*Under Secretary of Commerce for Intellectual Property and*
*Director of the United States Patent and Trademark Office*